United States Patent
Yakubisin (10) Patent No.: US 12,461,873 B2
(45) Date of Patent: Nov. 4, 2025

(54) ELECTRONIC CABLE WITH EMBEDDED DIGITAL IDENTIFICATION MODULE

(71) Applicant: Honeywell Federal Manufacturing & Technologies, LLC, Kansas City, MO (US)

(72) Inventor: Kyle Francis Yakubisin, Olathe, KS (US)

(73) Assignee: Honeywell Federal Manufacturing & Technologies, LLC, Kansas City, MO (US)

(*) Notice: Subject to any disclaimer, the term of this patent is extended or adjusted under 35 U.S.C. 154(b) by 195 days.

(21) Appl. No.: 18/346,912

(22) Filed: Jul. 5, 2023

(65) Prior Publication Data
US 2025/0013591 A1    Jan. 9, 2025

(51) Int. Cl.
    *G06F 13/38*    (2006.01)
(52) U.S. Cl.
    CPC .......... *G06F 13/38* (2013.01); *G06F 2213/40* (2013.01)
(58) Field of Classification Search
    CPC .. G06F 13/38; G06F 2213/40; G06F 2113/16; G06F 2213/0052
    See application file for complete search history.

(56) References Cited

U.S. PATENT DOCUMENTS

| | | | | |
|---|---|---|---|---|
| 6,131,125 A | * | 10/2000 | Rostoker | G06F 13/385 709/227 |
| 2005/0182876 A1 | * | 8/2005 | Kim | G06F 13/385 710/100 |
| 2010/0283532 A1 | * | 11/2010 | Horan | H04L 25/03885 327/530 |
| 2015/0026366 A1 | * | 1/2015 | Altmann | G06F 13/36 710/14 |
| 2023/0394003 A1 | * | 12/2023 | Qian | G06F 8/61 |

* cited by examiner

*Primary Examiner* — Idriss N Alrobaye
*Assistant Examiner* — Richard B Franklin
(74) *Attorney, Agent, or Firm* — Hovey Williams LLP (57) ABSTRACT

An electronic cable configured to communicatively link first and second electronic components together, the electronic cable broadly comprising opposing first and second ends and a digital identification module embedded between the first and second ends. The digital identification module broadly comprises a processing element and a memory element. The processing element is configured to receive a first query signal. The memory element is communicatively coupled to the processing element and configured to store data corresponding to the electronic cable. The processing element is configured to generate a first data signal representative of at least some of the data in response to the first query signal.

20 Claims, 7 Drawing Sheets

ELECTRONIC CABLE WITH EMBEDDED DIGITAL IDENTIFICATION MODULE

GOVERNMENT INTERESTS

This invention was made with Government support under Contract No.: DE-NA-0002839 awarded by the United States Department of Energy/National Nuclear Security Administration. The Government has certain rights in the invention.

BACKGROUND

Networked electronic assemblies often have convoluted electronic cable configurations communicatively connecting electronic devices together. Determining an active configuration of a networked electronic assembly requires a manual inspection, disconnection, and/or a trial and error electronic analysis of connected electronic devices. This can be time consuming and prone to inaccuracies. Modifications to the networked electronic assembly may require an entirely new assessment of the networked electronic assembly. Furthermore, some data corresponding to some electronic cables cannot be obtained by manual inspection or electronic analysis.

SUMMARY

Embodiments of the invention solve the above-mentioned problems and other problems and provide a distinct advancement in the art of electronic cables. More particularly, the invention provides an electronic cable that provides data corresponding to the electronic cable in response to a query signal. An active configuration of a networked electronic assembly including the electronic cable can be determined at least partially from the data corresponding to the electronic cable.

An embodiment of the electronic cable broadly comprises opposing first and second ends and a digital identification module embedded between the first and second ends. The electronic cable can be incorporated into a networked electronic assembly for modular and scalable data acquisition of components in the networked electronic assembly including the electronic cable.

The first end may include a consolidated portion (including a number of wires grouped together), a number of branches (e.g., individual wires emanating from the consolidated portion), and a number of terminuses for connecting to other electronic components (i.e., an electronic device or another electronic cable). The first end may therefore form a network bus.

The consolidated portion leads from the embedded digital identification module to the branches. The consolidated portion includes a number of wires grouped together and hence carries electronic signals for all of the terminuses.

The branches split from the consolidated portion to the terminuses. Each branch may only carry electronic signals to or from corresponding terminuses.

The terminuses are configured to electronically connect to other electronic devices or electronic cables. To that end, the terminuses may be cable connectors, adaptors, leads, hardwired connections, or the like. Each terminus may be different depending on the electronic device or electronic cable to which that particular terminus is connected.

The second end is substantially similar to the first end and thus will not be described further.

The embedded digital identification module includes a processing element, a memory element, and a number of ports. The embedded digital identification module is disposed between the first and second ends. The embedded digital identification module may utilize VDC power lines to communicate with a cable identification terminal and with other embedded digital identification modules. For example, the embedded digital identification module may utilize a 5 VDC line and a 5 VDC return line to both power the modules and provide communication.

The processing element is communicatively coupled to the terminuses of the first and second ends. The processing element is also communicatively coupled to the memory element.

The memory element is communicatively coupled to the processing element and is configured to store data corresponding to the electronic cable. For example, the data may be configuration data, programmable parameters, and other information.

The ports are configured for various communication and power schemes for the digital identification module. For example, the ports may be differential in both AC or DC coupling for power and communications.

An exemplary use of the electronic cable in a networked electronic assembly will now be described. First, a query is sent from a cable identification terminal via the first end of the electronic cable. The embedded digital identification module then receives the query and replies via the first end with stored configuration data about the electronic cable. The embedded digital identification module may also send a query via the second end for determining if other electronic components are connected to the electronic cable. The embedded digital identification module then receives replies from the other electronic components (if any are connected) via the second end. The embedded digital identification module then sends the replies (or data received in the replies) to the cable identification terminal via the first end. Data transmitted in response to queries may include configuration data, connection data, other programmable parameters, and general data stored on each electronic component.

The above-described electronic cable and networked electronic assembly provide several advantages. For example, the electronic cable allows for automatic retrieval of configuration information and other programmable parameters of multiple electronic cables and other electronic components through electronic interfaces (e.g., the embedded digital identification module). The electronic cable, particularly when used in a networked electronic assembly, provides a modularity and scalability for reporting an active configuration of multiple electronic cables and other electronic components. To that end, the electronic cable provides a data acquisition solution for a cable configuration that may be elaborate, convoluted, modified, poorly documented, unknown, and/or inaccessible.

The embedded digital identification module eliminates the need to disassemble or disrupt networked cable assemblies to acquire configuration data of the networked cable assemblies or components thereof. This is particularly useful when a networked electronic assembly is modified.

Furthermore, the embedded digital identification module may have a small form factor with a minimum of 2-wire overhead per connection. The embedded digital identification module may have other configurations for different communication and power schemes.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
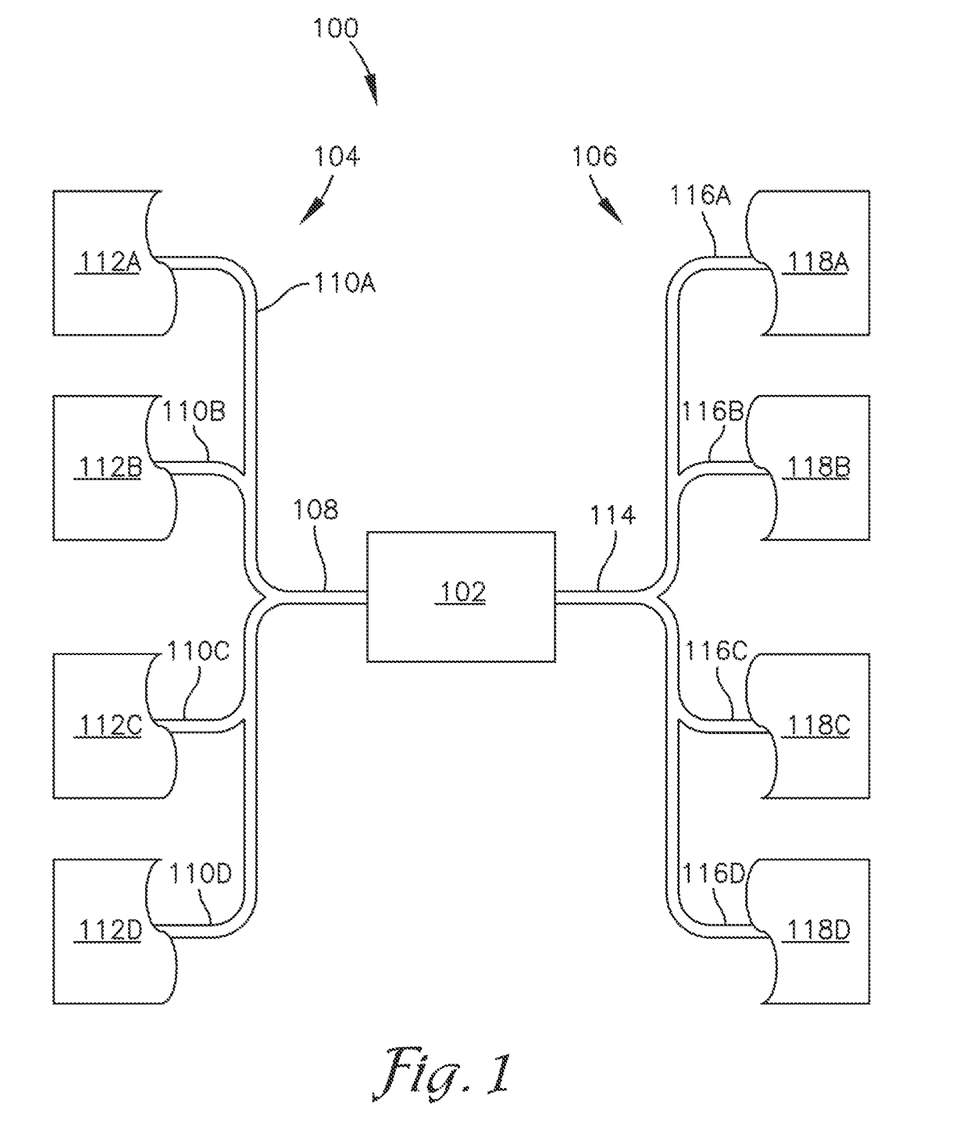
FIG. 1 is a schematic diagram of an electronic cable constructed in accordance with an embodiment of the invention.
Figure 2:
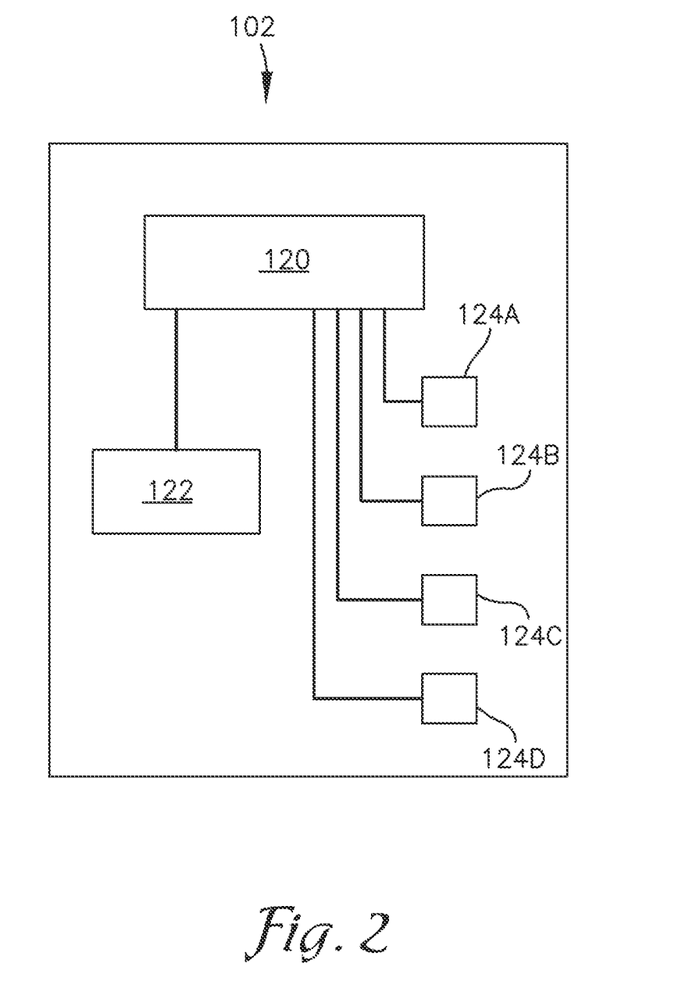
FIG. 2 is a schematic diagram of an embedded digital identification module of the electronic cable of FIG. 1.

Turning to the drawing figures, and particularly FIGS. 1 and 2, an electronic cable 100 including an embedded digital identification module 102 constructed in accordance with an embodiment of the invention is illustrated. The electronic cable 100 broadly comprises opposing first and second ends 104, 106 and the aforementioned embedded digital identification module 102.

The first end 104 may include a consolidated portion 108, a plurality of branches 110A-D, and a plurality of terminuses 112A-D for connecting to other electronic components (i.e., an electronic device or another electronic cable). The first end 104 may therefore form a network bus (e.g., for connecting to network A).

The consolidated portion 108 leads from the embedded digital identification module 102 to the branches 110A-D. The consolidated portion 108 includes a number of wires grouped together and hence carries electronic signals for all of the terminuses 112A-D. The consolidated portion 108 carries electronic signals for all of the terminuses 112A-D.

The branches 110A-D emanate from the consolidated portion 108 to the terminuses 112A-D. Each branch 110A-D may only carry electronic signals to or from corresponding terminuses 112A-D.

The terminuses 112A-D are configured to electronically connect to other electronic devices or electronic cables. To that end, the terminuses 112A-D may be cable connectors, adaptors, leads, hardwired connections, or the like. Each terminus 112A-D may be different depending on the electronic device or electronic cable to which that particular terminus 112A-D is connected.

The second end 106 may include a consolidated portion 114, a plurality of branches 116A-D, and a plurality of terminuses 118A-D for connecting to other electronic components (i.e., an electronic device or another electronic cable). The second end 106 may therefore form a network bus (e.g., for connecting to network B).

The consolidated portion 114 leads from the embedded digital identification module 102 to the branches 116A-D. The consolidated portion 114 includes a number of wires grouped together and hence carries electronic signals for all of the terminuses 118A-D. The consolidated portion 114 carries electronic signals for all of the terminuses 118A-D.

The branches 116A-D emanate from the consolidated portion 114 to the terminuses 118A-D. Each branch 116A-D may only carry electronic signals to or from corresponding terminuses 118A-D.

The terminuses 118A-D are configured to electronically connect to other electronic devices or electronic cables. To that end, the terminuses 118A-D may be cable connectors, adaptors, leads, hardwired connections, or the like. Each terminus 118A-D may be different depending on the electronic device or electronic cable to which that particular terminus 118A-D is connected.

The embedded digital identification module 102 may include a processing element 120, a memory element 122, and a plurality of ports 124A-D. The embedded digital identification module 102 may be disposed between the first and second ends 104, 106, and more particularly, between the consolidated portion of the first end 104 and the consolidated portion of the second end 106. The embedded digital identification module 102 may utilize VDC power lines to communicate with a cable identification terminal and with other embedded digital identification modules. For example, the embedded digital identification module 102 may utilize a 5 VDC line and a 5 VDC return line to both power the modules and provide communication.

The processing element 120 may be communicatively coupled to the terminuses 112A-D and 118A-D. The processing element 120 may also be communicatively coupled to the memory element 122.

The processing element 120 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 120 may generally execute, process, or run instructions, code, code segments, code statements, software, firmware, programs, applications, apps, processes, services, daemons, or the like. The processing element 120 may also include hardware components such as registers, finite-state machines, sequential and combinational logic, configurable logic blocks, and other electronic circuits that can perform the functions necessary for the operation of the current invention. In certain embodiments, the processing element 120 may include multiple computational components and functional blocks that are packaged separately but function as a single unit.

The memory element 122 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, flash memory, or the like, or combinations thereof. In some embodiments, the memory element 122 may be embedded in, or packaged in the same package as, the processing element 120. The memory element 122 may include, or may constitute, a non-transitory "computer-readable medium". The memory element 122 may store the instructions, code, code statements, code segments, software, firmware, programs, applications, apps, services, daemons, or the like that are executed by the processing element 120. The memory element 122 may also store data that is received by the processing element 120 as discussed in more detail below. The memory element 122 may further store data or intermediate results generated during processing, calculations, and/or computations as well as data or final results after processing, calculations, and/or computations. In addition, the memory element 122 may store settings, data, documents, sound files, photographs, movies, images, databases, and the like.

The ports 124A-D may be configured for various communication and power schemes. For example, the ports 124A-D may be differential in both AC or DC coupling for power and communications.

Figure 3:
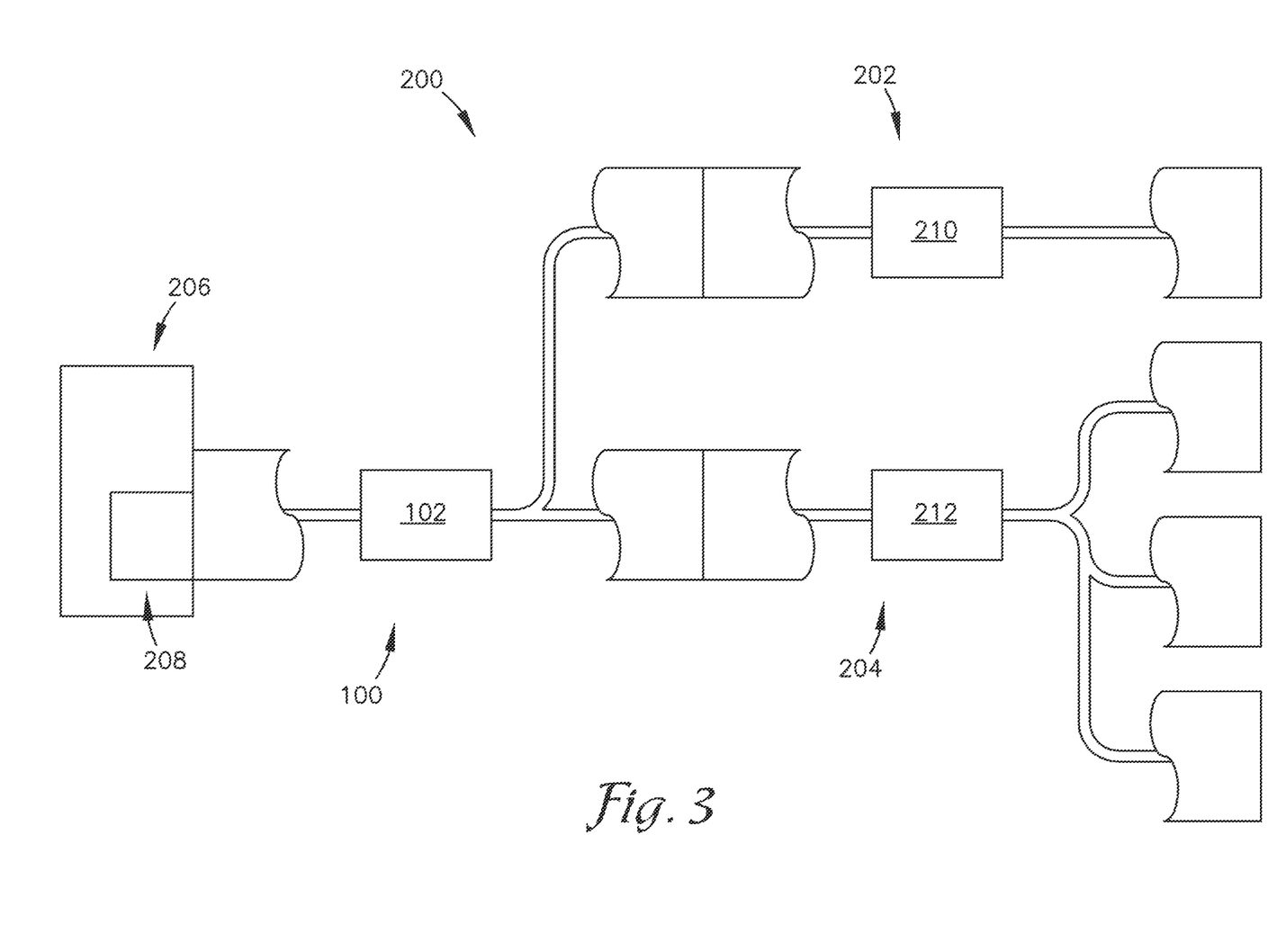
FIG. 3 is a schematic diagram of a networked electronic assembly including the electronic cable of FIG. 1 in accordance with an embodiment of the invention.

Turning to FIG. 3, the electronic cable 100 may be used in a networked electronic assembly 200 in an exemplary embodiment. The networked electronic assembly 200 is shown to include additional electronic cables 202, 204, and an electronic device 206 (including a cable identification terminal 208).

The additional electronic cables 202, 204 each have an embedded digital identification module 210, 212 respectively, and are substantially similar to the electronic cable 100 described above and thus will not be described in detail. The additional electronic cables 202, 204 are connected to the electronic cable 100 opposite the electronic device 206. Electronic cable 100 is connected between the electronic device 206 and the additional electronic cables 202, 204. In this way, some electronic components (such as electronic cables) may have a series relation to each other while others may have a parallel relation to each other.

With such communication connections between the electronic components, and as described in more detail below, the electronic device 206 can query and control the entire networked electronic assembly 200 at an application level. In this way, a service, application, or user may automatically query physical configuration data of cables (e.g., electronic cables 100, 202, 204) or other electronic devices connected in the networked electronic assembly 200.

Figure 4:
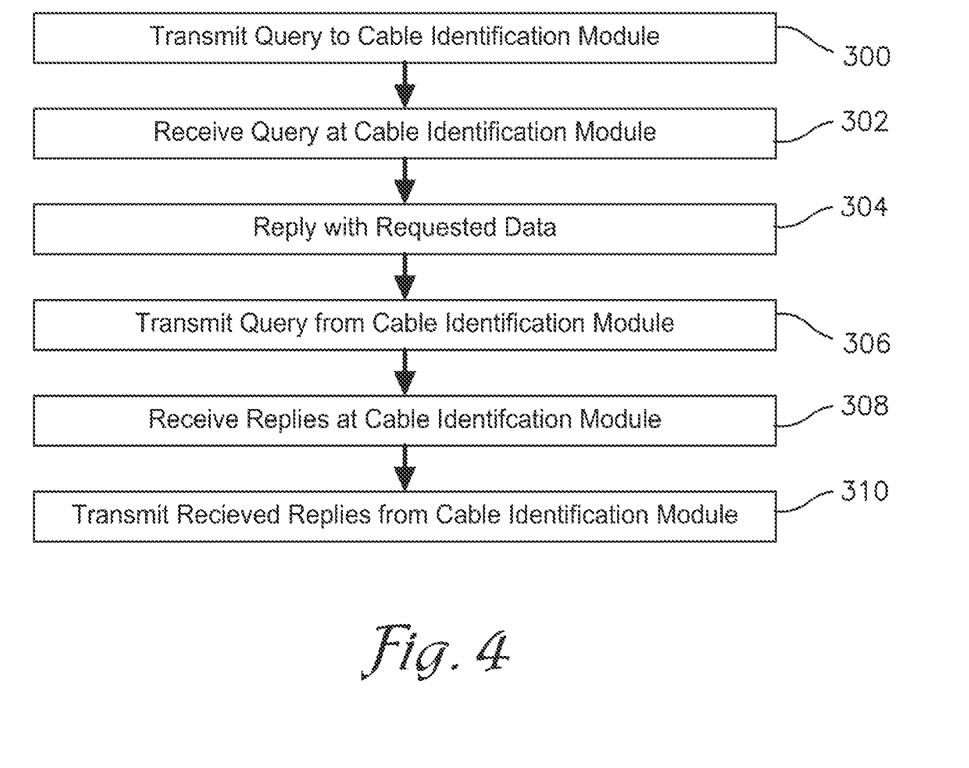
FIG. 4 is a flow diagram depicting certain method steps of querying components of a networked electronic assembly in accordance with an embodiment of the invention.

Turning to FIG. 4, and with reference to FIGS. 1-3, an exemplary use of the electronic cable 100 in the networked electronic assembly 200 will now be described. First, a query may be sent from the cable identification terminal 208 via the first end 104 of the electronic cable 100, as shown in block 300. The embedded digital identification module 102 may receive the query, as shown in block 302. The embedded digital identification module 102 may then reply via the first end 104 with data corresponding to the electronic cable 100 stored on the memory element 122, as shown in block 304. The embedded digital identification module 102 may also send a query via the second end 106 for determining if other electronic components are directly or indirectly connected to the electronic cable 100 downstream of the electronic cable 100 (relative to the cable identification terminal 208), as shown in block 306. The embedded digital identification module 102 may then receive replies from the other electronic components via the second end 106, as shown in block 308. The embedded digital identification module 102 may then send the replies (or data received in the replies) to the cable identification terminal 208 via the first end 104, as shown in block 310. Data transmitted in response to queries may include configuration data, connection data, programmable parameters, and general data stored on each electronic component.

Figure 5:
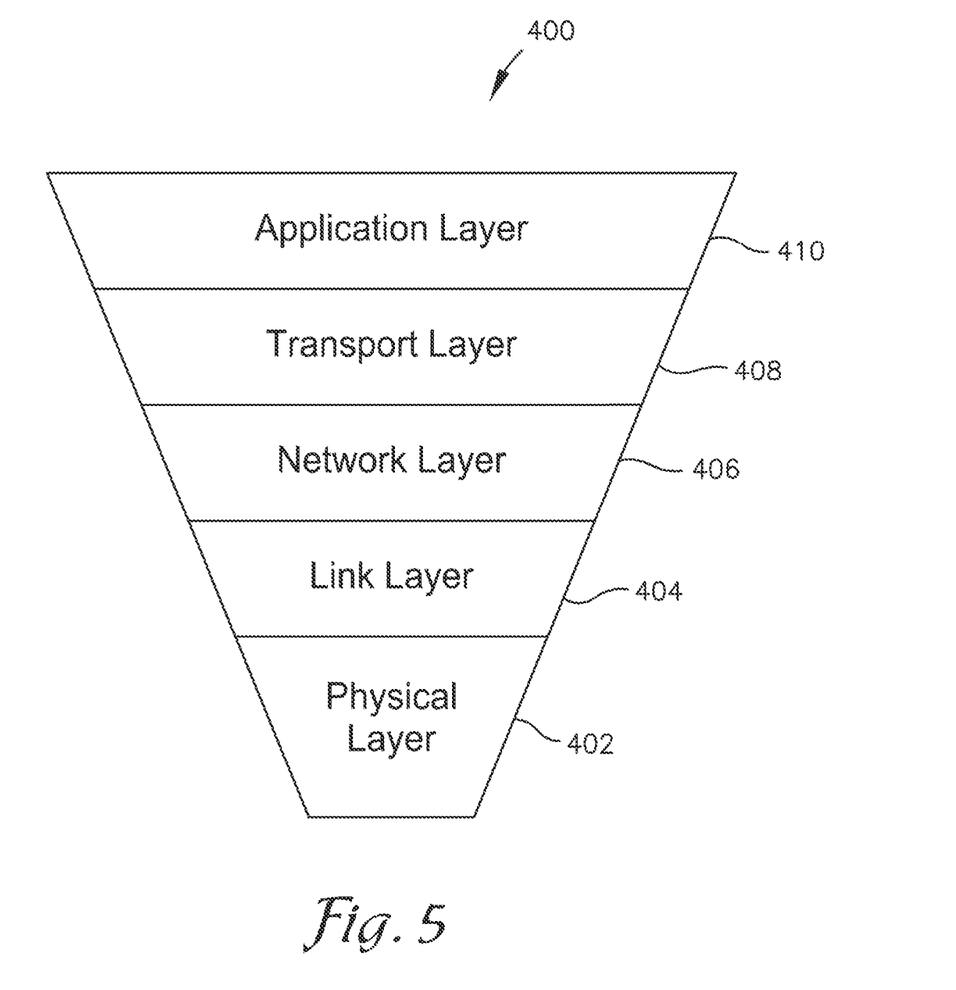
FIG. 5 is a schematic diagram of an Open Systems Interconnection (OSI) model in accordance with an embodiment of the invention.

Turning to FIG. 5, the embedded digital identification module 102 may utilize a simplified five layer OSI model 400 utilizing a mix of Commercial Off The Shelf (COTS) and custom solutions for the layer. Specifically, the model 400 may include a physical layer 402, a link layer 404, a network layer 406, a transport layer 408, and an application layer 410.

The physical layer 402 is considered the bottom most concrete layer and may include an RS485 power-over-bus solution utilizing a 5 VDC line and a 5 VDC return line to both power the modules and provide communication.

The link layer 404 establishes stable communication on the physical bus for the embedded digital identification modules 102, 210, 212 and the cable identification terminal 208. The link layer 404 may be handled by a custom state machine, which will be described in more detail below.

The network layer 406 may establish global addressing for the networked electronic assembly 200 so that each embedded digital identification module 102, 210, 212 and the cable identification terminal 208 can communicate with each other. This may be considered a simplified Local Area Network (LAN) solution.

The transport layer 408 utilizes Transmission Control Protocol (TCP) and User Datagram Protocol (UDP) COTS solutions.

The application layer 410 may include a node application and a terminal application. The node application may handle data and parameter management on the embedded digital identification modules 102, 210, 212 and high level communication from itself to other nodes or terminal applications running on other electronic devices. The terminal application may run on end items or hosts to query and control the networked electronic assembly 200. This may link with an inter-integrated circuit (I2C) or serial peripheral interface (SPI) for easy control through a large automated system or a user.

Figure 6:
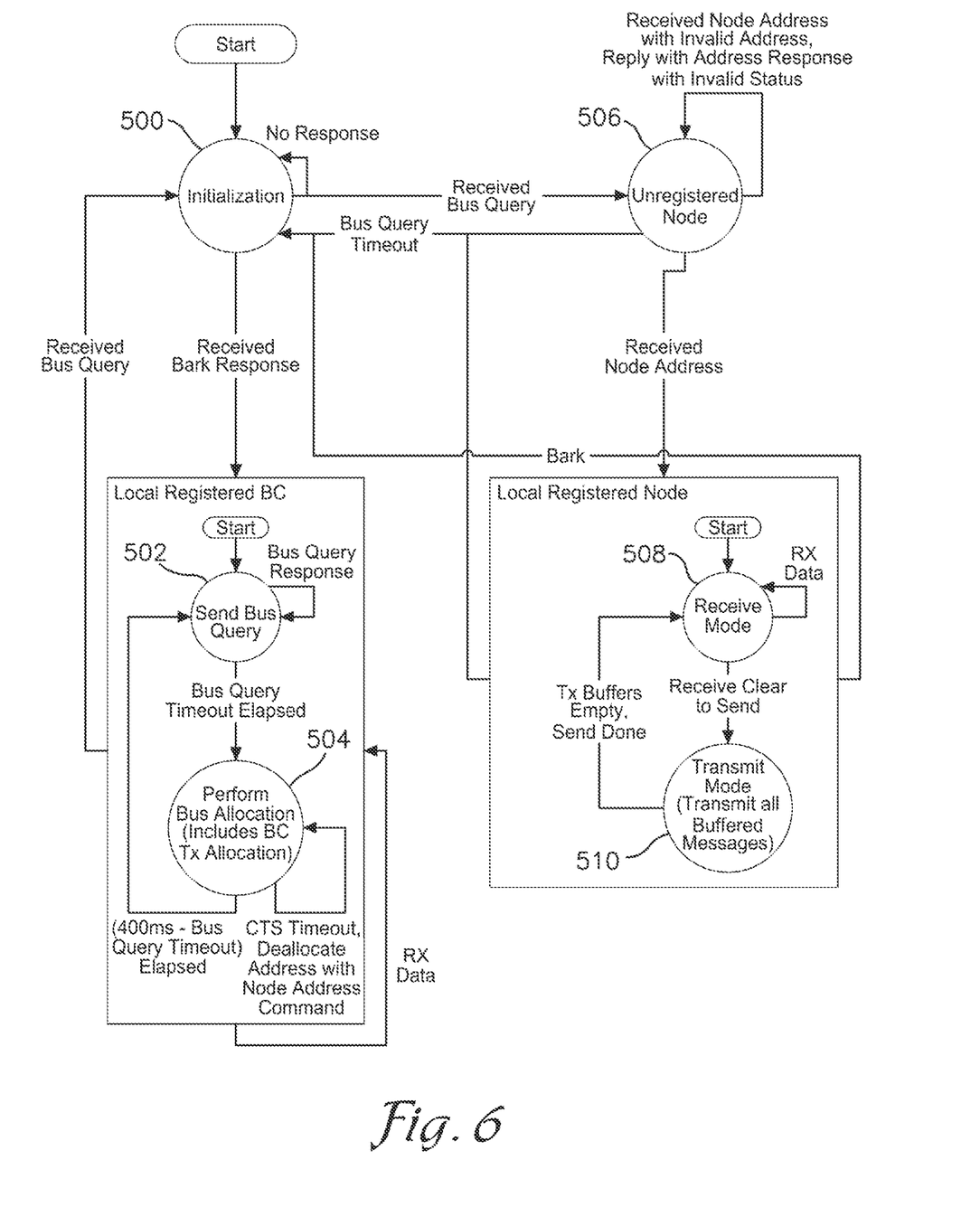
FIG. 6 is a flow diagram depicting certain method steps of the OSI model of FIG. 5 in accordance with an embodiment of the invention.

Turning to FIG. 6, the custom state machine of the link layer 404 will now be described in more detail. The custom state machine may use certain commands including the following: A bark may be sent by any element in the network in initialization. A bark response may be sent by a node. A bus query may be sent by a local registered bus controller (BC). A node address request may be sent by unregistered nodes. A node address assign command may be sent by the BC. A node address response may be sent by nodes. A node address acknowledgement may be sent by the BC. A clear-to-send (CTS) signal may be sent by the BC and may contain a timeframe in milliseconds. A "done" signal may be sent by nodes to release control of the bus. This increases bus capacity if a single node has more data to transmit.

Additionally, the BC may give each embedded digital identification module 102, 210, 212 a unique serial number. The serial numbers may be independent from the electronic cable in which the module are embedded. The BC may also register a local address to cut down overhead.

First, an initialization may be triggered by any of the embedded digital identification modules 102, 210, 212 or the cable identification terminal 208 in which such component sends a bark, as shown in block 500. For example, initialization may entail waiting one second then sending out a bark approximately every 500 ms plus or minus 10 ms randomized. A source address may also be randomized with only available addresses.

If the BC receives a bark response from a node or receives a bus query response, the BC may perform the following actions. First, the BC may send out a bus query (block 502). This may be performed at least once every 400 ms to not timeout. The BC may hold the bus open for nodes for a variable timeout period after the bus query. If a bus query timeout has elapsed, the BC performs a bus allocation, as shown in block 504.

The BC may determine average time durations on the bus for each node and send out CTS signals with that duration to give each node. Also note bus query responses may be sent uniform distribution randomly during a transmit period after a bus query is received.

If a bus query is received from the BC, and a node address with an invalid address is received, a reply with an address response including an invalid status may be sent, indicating the node may be an unregistered node, as seen in block 506. On the other hand, if a node address is received, the node may be deemed a local registered node.

In this case, the local registered node may perform the following actions. First, the local registered node may enter a receive mode in which it receives data, as shown in block 508. Upon receiving a CTS signal, the local registered node may enter a transmit mode, as shown in block 510. In the transmit mode, the local registered node may transmit buffered messages. Once transmission buffers are empty, the local registered node may send a "Done" signal indicating release of control of the bus. This increases bus capacity if a node has more data to transmit.

Figure 7:
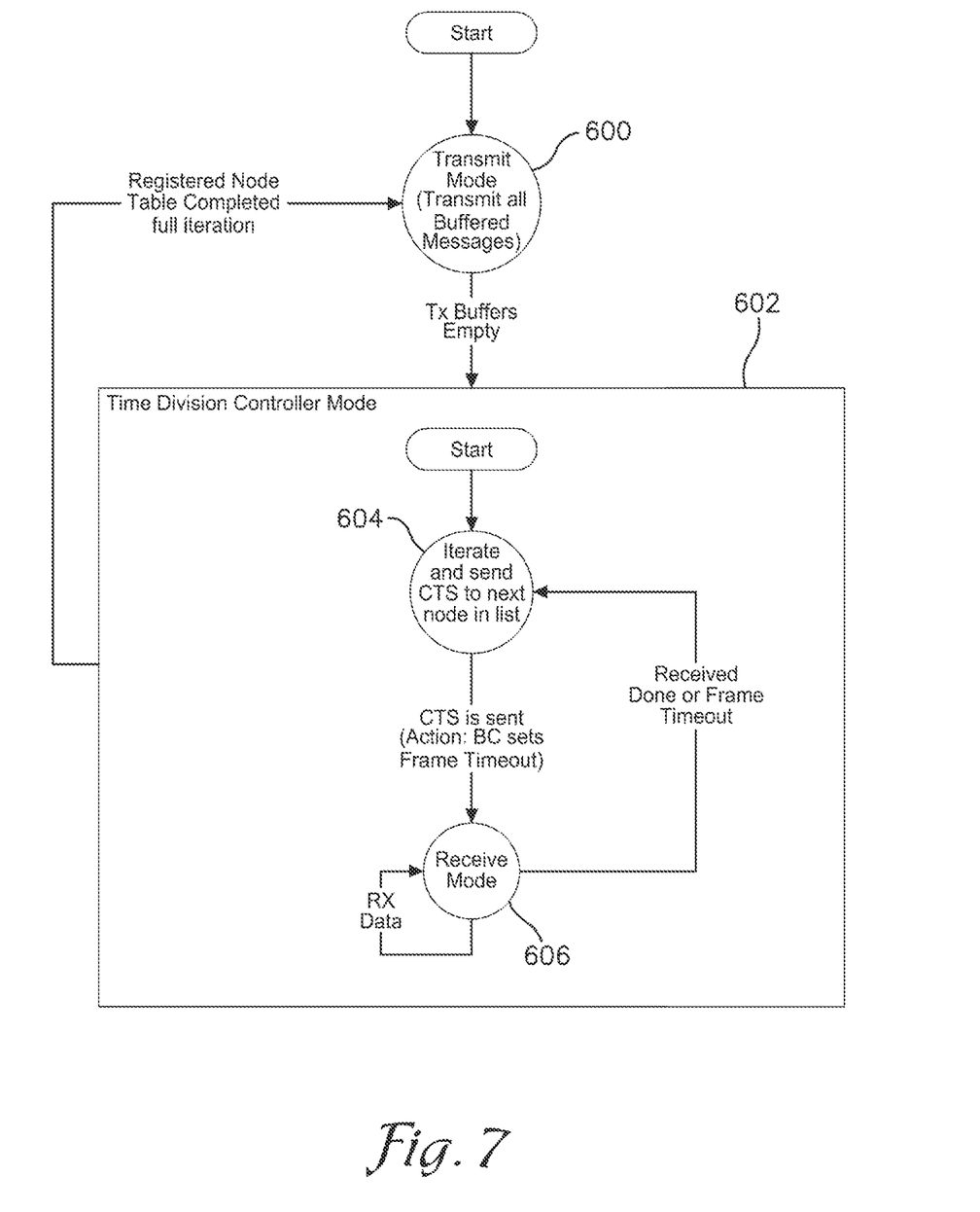
FIG. 7 is a flow diagram depicting certain method steps of the OSI model of FIG. 5 in accordance with an embodiment of the invention.

Turning to FIG. 7, bus allocation will be described in more detail. First, in a transmit mode, buffered messages may be transmitted, as shown in block 600. Once transmission buffers are empty, a time division controller mode may be entered, as shown in block 602. In the time division controller mode, CTS signals may be sent to the next node in a list of nodes, as shown in block 604. To that end, the BC may set a frame timeout. A receive mode in which data is received may then be entered, as shown in block 606. A "Done" signal may then be received to indicate all the data has been received or the frame timeout may trigger. In either case, the state machine returns to block 604. The time division controller mode may be exited once a registered node table iteration is completed, at which point the state machine returns to block 600.

The above-described electronic cable 100 and networked electronic assembly 200 provide several advantages. For example, the electronic cable 100 allows for automatic retrieval of configuration information and other programmable parameters of multiple electronic cables and other electronic components through electronic interfaces (e.g., the embedded digital identification module). The electronic cable 100, particularly when used in networked electronic assembly 200, provides a modularity and scalability for reporting an active configuration of multiple electronic cables and other electronic components. To that end, the electronic cable 100 provides a data acquisition solution for a cable configuration that may be elaborate, convoluted, modified, poorly documented, unknown, and/or inaccessible.

The embedded digital identification module 102 eliminates the need to disassemble or disrupt networked cable assemblies to acquire configuration data of the networked cable assemblies or components thereof. This is particularly useful when a networked electronic assembly is modified.

Furthermore, the embedded digital identification module 102 may have a small form factor with a minimum of 2-wire overhead per connection. The embedded digital identification module 102 may have other configurations for different communication and power schemes.

ADDITIONAL CONSIDERATIONS

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 110(f) unless traditional means-plus-function language is expressly recited, such as "means for" or "step for" language being explicitly recited in the claim(s).

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An electronic cable configured to communicatively link first and second electronic components together, the electronic cable comprising:
   a first end configured to be connected to the first electronic component;
   a second end configured to be connected to the second electronic component; and
   a digital identification module embedded between the first and second ends, the digital identification module comprising:
     a processing element configured to receive a first query signal; and
     a memory element communicatively coupled to the processing element and configured to store data corresponding to the electronic cable,
     the processing element being configured to generate a first data signal representative of at least some of the data in response to the first query signal,
   wherein the digital identification module is configured to utilize an open systems interconnection (OSI) model including:
     a physical layer configured to provide electrical power and communication;
     a link layer configured to establish communication on the physical layer via a communication bus;

a network layer configured to establish addressing for directing communication;
a transport layer configured to utilize a communication protocol; and
an application layer including:
a node application configured to handle data and parameter management on the digital identification module and high-level communication; and
a terminal application configured to query and control the first and second electronic components.

2. The electronic cable of claim 1, the processing element being further configured to generate a second query signal and receive a second data signal representative of data corresponding to the second electronic component in response to the second query signal.

3. The electronic cable of claim 1, wherein the digital identification module is configured to transmit the first data signal to the first electronic component via the first end.

4. The electronic cable of claim 1, further comprising a 5 volt direct current (VDC) line and a 5 VDC return line on the physical layer for provision of power to the processing element and transmission of the first query signal and the first data signal.

5. The electronic cable of claim 1, wherein at least one of the first and second ends includes a plurality of terminuses.

6. The electronic cable module of claim 1, the data being configuration data of the electronic cable.

7. The electronic cable of claim 1, the data being programmable parameters associated with the electronic cable.

8. A digital identification module configured to be embedded in a first electronic cable, the digital identification module comprising:
a processing element configured to receive a first query signal; and
a memory element communicatively coupled to the processing element and configured to store data corresponding to the electronic cable,
the processing element being configured to generate a first data signal representative of at least some of the data stored on the memory element in response to the first query signal,
wherein the digital identification module is configured to utilize an open systems interconnection (OSI) model including:
a physical layer configured to provide electrical power and communication;
a link layer configured to establish communication on the physical layer via a communication bus;
a network layer configured to establish addressing for directing communication;
a transport layer configured to utilize a communication protocol; and
an application layer including:
a node application configured to handle data and parameter management on the digital identification module and high-level communication; and
a terminal application configured to query and control electronic components connected directly or indirectly to the first electronic cable.

9. The digital identification module of claim 8, the processing element being further configured to generate a second query signal and receive a second data signal representative of data corresponding to the second electronic component in response to the second query signal.

10. The digital identification module of claim 8, further comprising a 5 volt direct current (VDC) line and a 5 VDC return line on the physical layer for provision of power to the processing element and transmission of the first query signal and the first data signal.

11. The digital identification module of claim 8, the data being configuration data of the first electronic cable.

12. The digital identification module of claim 8, the data being programmable parameters associated with the first electronic cable.

13. An electronic assembly configured to be communicatively linked to a querying device, the electronic assembly comprising:
a plurality of electronic cables, each comprising:
opposing first and second ends; and
a digital identification module configured to be integrated between the first and second ends, the digital identification module comprising:
a processing element configured to receive a first query signal; and
a memory element communicatively coupled to the processing element and configured to store data corresponding to the electronic cable,
the processing element being configured to generate a first data signal representative of at least some of the data stored on the memory element in response to the first query signal,
wherein the digital identification module is configured to utilize an open systems interconnection (OSI) model including:
a physical layer configured to provide electrical power and communication;
a link layer configured to establish communication on the physical layer via a communication bus;
a network layer configured to establish addressing for directing communication;
a transport layer configured to utilize a communication protocol; and
an application layer including:
a node application configured to handle data and parameter management on the digital identification module and high-level communication; and
a terminal application configured to query and control electronic components connected directly or indirectly to the first electronic cable.

14. The electronic assembly of claim 13, wherein at least one of the first and second ends of at least one of the plurality of electronic cables includes a plurality of terminuses.

15. The electronic assembly of claim 13, at least two of the plurality of electronic cables having a series relation to each other.

16. The electronic assembly of claim 13, at least two of the plurality of electronic cables having a parallel relation to each other.

17. The electronic assembly of claim 13, at least one of the plurality of electronic cables being configured to be directly connected to the querying device.

18. The electronic assembly of claim 13, wherein the processing elements of the digital identification modules are configured to communicate with each other via global addressing.

19. The electronic cable of claim 13, wherein the link layers are configured to, via a state machine, over the communication bus:
trigger an initialization of one of the digital identification modules via transmission of a bark from another one of the digital identification modules;

transmit a bark response via the one of the digital identification modules;

upon receiving the bark response or a bus query response, transmit a bus query via a local registered bus controller (BC);

hold the communication bus open until a bus query timeout has elapsed; and perform a bus allocation upon elapse of the bus query timeout.

20. The electronic cable of claim 13, wherein the bus allocation includes:

a transmit mode in which buffered messages are transmitted; and a time division controller mode including:

iterative transmission of a clear to send (CTS) signal; and a receive mode in which data is received.

\* \* \* \* \*